United States Patent
Chan et al.

(10) Patent No.: US 6,441,643 B1
(45) Date of Patent: *Aug. 27, 2002

(54) METHOD AND APPARATUS FOR DRIVING MULTIPLE VOLTAGES

(75) Inventors: Francis Chan, Williston, VT (US); Bret R. Dale, Burlington, VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/514,394

(22) Filed: Feb. 28, 2000

(51) Int. Cl.[7] .......................................... H03K 19/0175
(52) U.S. Cl. .............................. 326/81; 326/56; 326/57; 326/58; 326/80; 326/113
(58) Field of Search ............................. 326/57, 58, 80, 326/81, 113, 56

(56) References Cited

U.S. PATENT DOCUMENTS

| | | | |
|---|---|---|---|
| 4,963,766 A | * 10/1990 | Lundberg | 326/58 |
| 5,151,619 A | 9/1992 | Austin et al. | 307/473 |
| 5,237,213 A | * 8/1993 | Tanoi | 327/205 |
| 5,245,230 A | * 9/1993 | Ohri et al. | 327/379 |
| 5,396,128 A | 3/1995 | Dunning et al. | 326/68 |
| 5,424,659 A | 6/1995 | Stephens | 326/81 |
| 5,537,060 A | * 7/1996 | Baek | 326/87 |
| 5,576,635 A | 11/1996 | Partovi et al. | 326/27 |
| 5,635,861 A | * 6/1997 | Chan et al. | 326/81 |
| 5,682,110 A | * 10/1997 | Rountree | 327/108 |
| 5,719,525 A | 2/1998 | Khoury | 327/562 |
| 5,804,998 A | 9/1998 | Cahill et al. | 327/108 |
| 5,864,243 A | 1/1999 | Chen et al. | 326/58 |
| 5,929,654 A | * 7/1999 | Park et al. | 326/58 |
| 5,929,667 A | 7/1999 | Abadeer et al. | 327/112 |
| 5,969,554 A | * 10/1999 | Chan et al. | 327/170 |
| 6,252,422 B1 | * 6/2001 | Patel et al. | 326/80 |

* cited by examiner

Primary Examiner—Michael G. Lee
Assistant Examiner—Steven S. Paik
(74) Attorney, Agent, or Firm—Richard A. Henkler

(57) ABSTRACT

A method and apparatus for implementing a dual voltage driver circuit having two predrive circuits for driving the supported voltages. The driver circuit automatically senses the operating voltage and selects the appropriate predrive circuitry while isolating the non-selected predrive circuitry from the sensed voltage.

9 Claims, 3 Drawing Sheets

METHOD AND APPARATUS FOR DRIVING MULTIPLE VOLTAGES

BACKGROUND

1. Technical Field of the Present Invention

The present invention generally relates to voltage driver circuits, and more specifically, to voltage driver circuits that support the ability to select among varying supported voltages for driving.

2. Background of the Present Invention

The electronic industry is in a state of evolution spurred by the recent changes in technology which have allowed greater functionality in smaller devices. This has resulted in the explosion of new found uses for such small devices (e.g. medical, monitoring etc.), as well as greater functionality in increasingly smaller electronic devices.

The evolution has caused electronic devices to become an inseparable part of our society. Consumers are now buying and demanding electronic devices which are smaller, more powerful, and faster at unprecedented rates. These demands are constantly driving the electronic industry to exceed limitations which were previously considered unsurpassable.

One area ripe for improvement is the output driver circuits that are designed into integrated circuits to provide communication with external circuitry via pins. Specifically, technology has advanced in recent times with an increased awareness towards power reduction. As a result of these advancements and to promote advantageous use of inventory, output driver circuits are often required to drive an upper and lower range of voltages to support both new and older technology interfacing. To perform this dual functionality these dual driver circuits typically include separate pre-driver circuitry for each of the supported voltage ranges. An unfortunate side affect of these current designs is that the pre-driver circuitry supporting the lower voltage driving must be designed so as to accept the higher voltage range during non-operation. This unnecessarily makes the lower voltage pre-driver circuitry slow.

It would, therefore, be a distinct advantage to have a dual mode voltage driver that would provide an upper and lower range of voltages without requiring the design of the pre-driver circuitry for the lower voltage to accept the higher voltage. It would be further advantages if this dual mode voltage driver would automatically sense the appropriate voltage level to select for the driving voltage. The present invention provides such a dual mode voltage driver.

SUMMARY OF THE PRESENT INVENTION

The present invention is a method and system for providing a dual voltage driver where the lower voltage predrive circuitry is isolated from the higher voltage of the higher voltage predrive circuitry during operation. The isolation allows the lower voltage predrive circuitry to operate at faster speeds since slower devices that can handle the higher voltage range are not required. In addition, the present invention also uses a automatic sensing circuit to select which predriver should be active based upon the voltage sensed for required operation.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

In the following description, numerous specific details are set forth in order to provide a thorough understanding of the present invention. However, it will be obvious to those of ordinary skill in the art that the present invention can be practiced with different details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention, and are within the skills of persons of ordinary skill in the relevant art.

Figure 1:
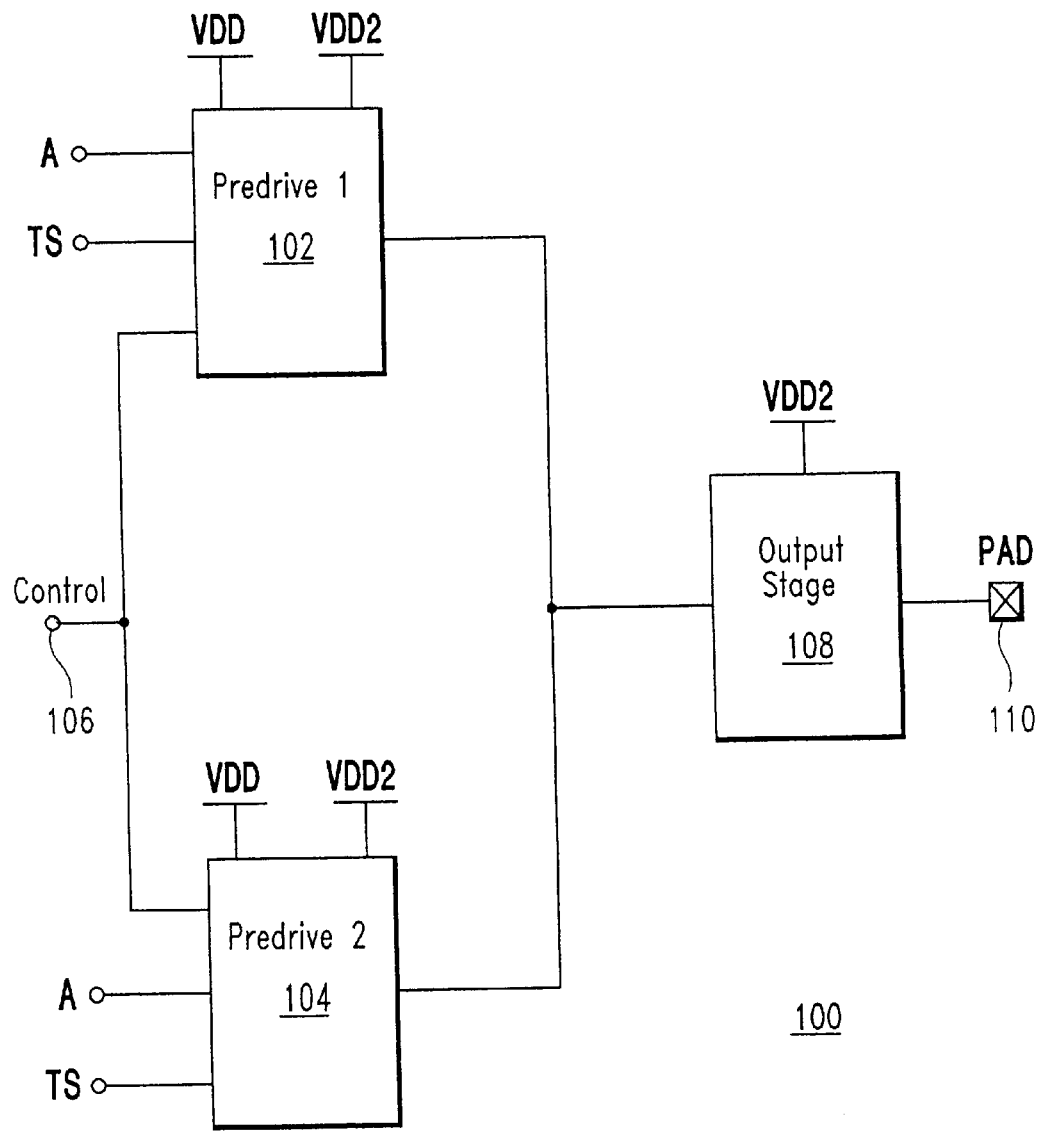
FIG. 1 (Prior Art) is a block diagram illustrating how a typical dual voltage driver circuit can be constructed.

FIG. 1 (Prior Art) is a block diagram illustrating how a typical dual voltage driver circuit 100 can be constructed. The driver circuit 100 includes two predrive circuits (102 and 104), an output stage 108, and a control select 106. Predrive circuits 102 and 104 drive their respective operating voltages to the output stage 108 when selected via control select 106. Output stage 108 drives the selected predrive voltage to the pad 110.

There are several disadvantages associated with the dual voltage driver circuit 100 that are best understood by way of example. For the moment, assume that the supported dual voltage ranges are 3.3 v and 1.5 v for predrive 1 102 and predrive 104, respectively. The selection for determining which voltage range (3.3 or 1.5) is driven is determined by the control select 106. In the 3.3 volt mode, predrive 1 102 is active and predrive 2 104 is in a high impedance state. In the 1.5 volt mode, predrive 2 104 is active and predrive 1 102 is in a high impedance state.

In this particular design, it is difficult for the driver circuit 100 to meet desirable performance goals when operating in the 1.5 v mode (predrive 2 104 active and predrive 1 102 high impedance). One such performance goal degradation results from requiring the output of predriver 2 104 to be level shifted since it is exposed to the 3.3 volts during 3.3 volt mode. The use of such a level shifter adds delay. Another such degradation results from the fact that newer technologies that have higher reliability specifications require the use of thick oxide devices anywhere voltages exceed the range of VDD (1.95 v). In this example, predriver 2 104 will be exposed to 3.3 volts during 3.3 volt mode. Thus, predriver 2 104 must use thick oxide devices which are much slower than typical thin oxide devices, especially when operating at 1.5 v.

Figure 2:
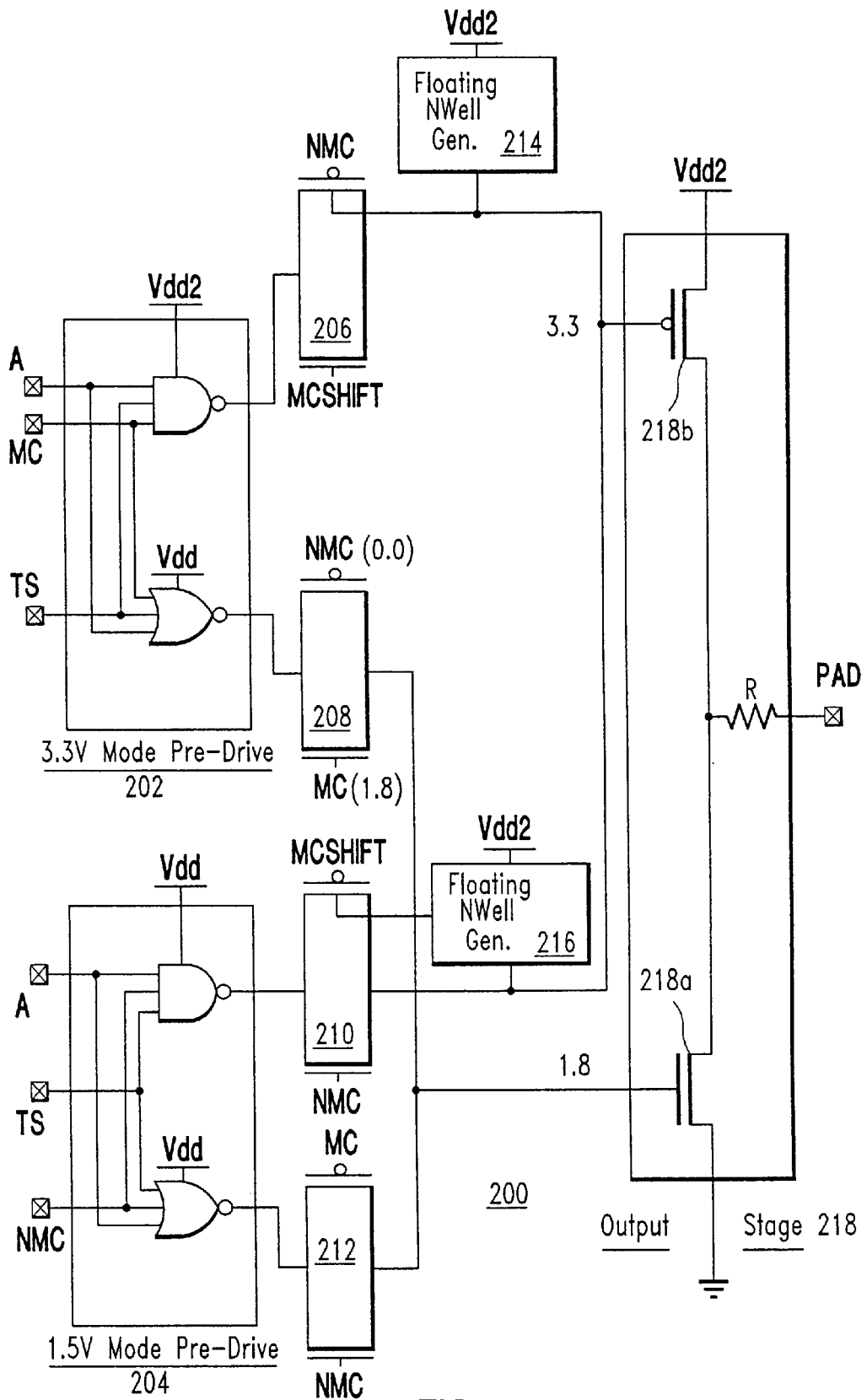
FIG. 2 is a schematic diagram of a dual mode dual voltage driver circuit constructed in accordance with a preferred embodiment of the present invention.

FIG. 2 is a schematic diagram of a dual mode dual voltage driver circuit 200 constructed in accordance with a preferred embodiment of the present invention. The circuit 200 includes a two predrive circuits 202 and 204, a plurality of transmission gates 206–212, two floating Nwell generators 214 and 216, and an output stage 218. The transmission gates 206–212 are used to protect the predrive circuits 202 and 204 during the selection of one of the supported dual voltages. The floating Nwell generators 214 and 216 are used to keep the PFETs of the passgates 206 and 210 at the highest voltage in the circuit. Predrive circuit 202 is used for driving 3.3 volts during 3.3 volt mode, and predrive circuit 204 is used for driving 1.5 volts during 1.5 volt mode. Those skilled in the relevant art will readily understand that other implementations for isolating the predrive circuits during non-operation could be used as well.

Both predrive circuits 202 and 204 include an input signal A and a signal TS for controlling the PFET 218b and NFET 218a of the output stage. Specifically, when signal TS equals one, the output stage 218 is in tri-state (PFET 218b off and NFET 218a off). Signals MC and NMC are used for activating and deactivating the appropriate predriver 202 or 204 and passgates 206–212 as explained in detail below. Signal MCSHIFT is used to gate the NFET in transmission gate 206 and PFET in transmission gates 210. The advantages of the present invention are best illustrated and understood by way of example as enumerated below.

Assume that signal MC is active, signal NMC is inactive, VDD is 1.8 volts, MCSHIFT is 3.3 volts, and VDD2 is 3.3 volts (i.e. the circuit is operating in 3.3 volt mode). In this example, the predrive 202 is driving 3.3 volts. Passgates 206 and 208 allow the signals from the predrive 202 to drive the output stage 218. Passgates 210 and 212 protect the predrive 204 from the higher voltages on the inputs to the output stage 218.

In contrast to the circuit 100 of FIG. 1, the predrive 204 is not exposed to the higher voltage (3.3 v), and therefore, does not require the slower thick oxide devices nor the level shifted output.

Now assume that signal NMC is active, MC is inactive, VDD is 1.8 volts, MCSHIFT is 0 volts, and VDD2 is 1.5 volts (i.e. the circuit is operating in 1.5 volt mode). In this example, the predrive 204 is driving 1.8 volts. Passgates 210 and 212 allow the signals from the predrive 204 to drive the output stage 218. Passgates 206 and 208 stop predriver 202 from effecting the state of the input pins to the output stage 218. In this mode (1.5 v), the output stage 218 can be overdriven with VDD (1.8 v) which is delivered from predrive 204 through the transmission gates 210 and 212.

Figure 3:
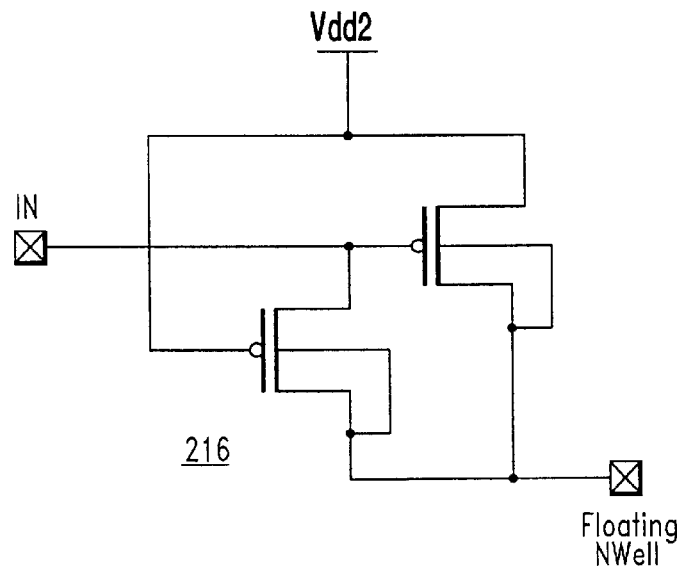
FIG. 3 is a schematic diagram illustrating how the floating nWell can be implemented.
Figure 4:
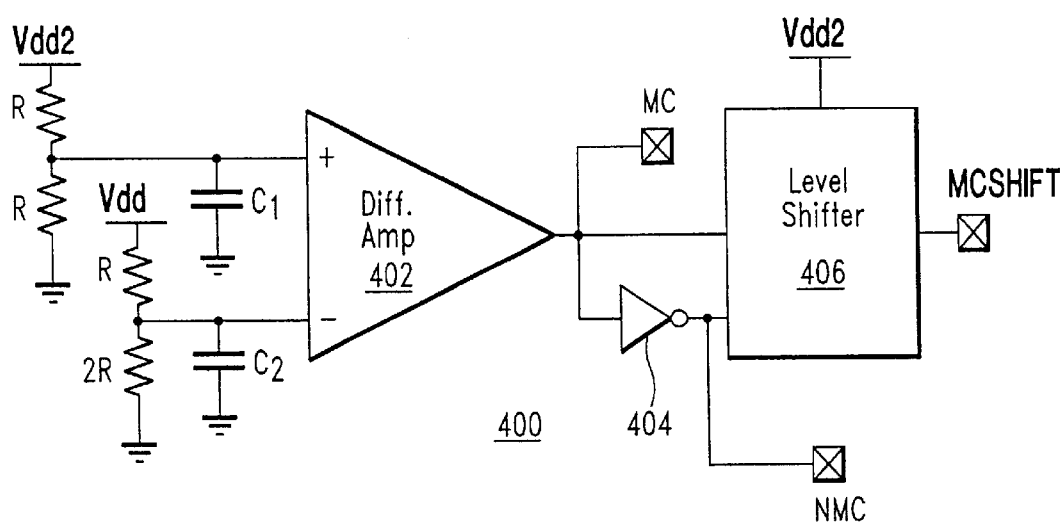
FIG. 4 is a schematic diagram illustrating an automatic mode sensing circuit that can be used to automatically sense the appropriate operating voltage and select the appropriate predrive circuit for the dual voltage driver circuit of FIG. 2 according to the teachings of the present invention.

FIG. 3 is a schematic diagram illustrating how the floating nWell 216 can be implemented. If two PFETs are connected as shown, the higher voltage of "IN" and "VDD2" will be passed to the "Floating nWell." The "Floating nWell" can then be passed to the nWell connections of the PFETs that see higher voltages. FIG. 4 is a schematic diagram illustrating an automatic mode sensing circuit 400 that can be used to generate the MC, NMC, and MCSHIFT signals for the dual voltage dual driver circuit 200 of FIG. 2 according to the teachings of the present invention. The automatic mode sensing circuit 400 senses the level of VDD2 relative to VDD and sets the MC, NMC, and MCSHIFT signals appropriately. More specifically, VDD and VDD2 are voltage divided by approximately half and ⅔, respectively and fed into the Differential Amplifier 402 as shown. Capacitors C1 and C2 are used to decouple any power bus noise. If VDD2 is in the higher range MC will be set to a logic value of one (i.e. MC has a voltage of VDD and NMC will have a voltage of zero). MCSHIFT is the MC signal level shifted up to the voltage level of VDD2.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. A voltage driver comprising:
    a first predrive circuit for receiving a data signal, and for driving the data signal, at a first voltage level that is greater than ground, on a transmission line;
    a second predrive circuit for receiving the data signals, and for driving the data signal, at a second voltage level that is greater than ground and less than the first voltage level, on the transmission line;
    means for activating either the first or second predrive circuits;
    means for isolating the non-selected predrive circuit from the voltage level driven by the selected predrive circuit on the transmission line.

2. The voltage driver of claim 1 wherein the means for isolating includes:
    a first pair of passgates for isolating the first predrive circuit from the voltage level of the second predrive circuit during operation of the second predrive circuit; and
    a second pair of passgates for isolating the second predrive circuit from the voltage level of the first predrive circuit during operation of the first predrive circuit.

3. The voltage driver of claim 2 wherein each of the passgates includes a NFET and a PFET, and the voltage driver further comprises:
    means for maintaining the substrates of one of the PFETs of one of the pairs of passgates at the highest voltage in the voltage driver.

4. The voltage driver of claim 1 wherein the first predrive circuit is comprised of thick oxide devices, and the second predrive circuit is comprised of thin oxide devices.

5. A method of providing more than one voltage by a voltage driver the voltage driver including first and second predrive circuits each of which receive the same enable and data signals, drive the data signal at voltage level that is different from the other, and are coupled one to another, the method comprising the steps of:
    selecting either the first or second predrive circuit; and
    isolating the non-selected predrive circuit from the voltage level driven by the selected predrive circuit.

6. A method of providing more than one voltage by a voltage driver having first and second predrive circuits each of which receive the same data signal, drive the data signal at a voltage level that is different from the other and are coupled one to another, the method comprising the steps of:
    sensing the voltage level at which the voltage driver is operating;
    automatically selecting either the first or second predrive circuit based upon the sensed voltage level; and
    isolating the non-selected predrive circuit from the voltage level driven by the selected predrive circuit.

7. A voltage driver comprising:
    an output driver having at least two inputs for driving a logical value received at the inputs;
    a first predrive circuit for receiving a data signal, and for driving the data signal at a first voltage level to the inputs of the output driver;
    a second predrive circuit for receiving the data signal, and for driving the data signal at a second voltage level, to the inputs of the output driver, an activation signal for activating either the first or second predrive circuits;

isolation circuitry for isolating the non-selected predrive circuit from the voltage level driven by the selected predrive circuit.

8. The voltage driver of claim 7 wherein the isolation circuitry includes:

a first pair of passgates for isolating the first predrive circuit from the voltage level of the second predrive circuit during operation of the second predrive circuit; and a second pair of passgates for isolating the second predrive circuit from the voltage level of the first predrive circuit during operation of the first predrive circuit.

9. The voltage driver of claim 8 wherein each of the passgates includes a NFET and a PFET, and the voltage driver further comprises:

means for maintaining the substrates of one of the PFETs of one of the pairs of passgates at the highest voltage in the voltage driver.

* * * * *